United States Patent [19]

Suzuki

[11] Patent Number: 5,751,999
[45] Date of Patent: May 12, 1998

[54] PROCESSOR AND DATA MEMORY FOR OUTPUTTING AND RECEIVING DATA ON DIFFERENT BUSES FOR STORAGE IN THE SAME LOCATION

[75] Inventor: Takao Suzuki, Hyogo, Japan

[73] Assignee: Matsushita Electric Industrial Co., Ltd., Osaka, Japan

[21] Appl. No.: 492,702

[22] Filed: Jun. 20, 1995

[30] Foreign Application Priority Data

Jun. 23, 1994 [JP] Japan .................................. 6-141650

[51] Int. Cl.$^6$ .......................... G06F 13/00; G06F 13/40
[52] U.S. Cl. .......................... 395/494; 395/308; 395/450; 395/482
[58] Field of Search .......................... 395/450, 458, 395/476, 482, 308, 474, 481, 494; 365/189.02, 189.05, 230.05, 230.03

[56] References Cited

U.S. PATENT DOCUMENTS

| | | | |
|---|---|---|---|
| 4,893,279 | 1/1990 | Rahman et al. | 365/230.03 |
| 4,933,909 | 6/1990 | Cushing et al. | 365/230.05 |
| 4,991,169 | 2/1991 | Davis et al. | 370/463 |
| 5,517,436 | 5/1996 | Andreas et al. | 364/736 |
| 5,544,351 | 8/1996 | Lee et al. | 395/559 |

Primary Examiner—Glenn Gossage
Attorney, Agent, or Firm—McDermott, Will & Emery

[57] ABSTRACT

A digital signal processor includes a data memory which can be connected to, each of an M-bus, an A-bus, and a B-bus, each serving as a data bus, a pointer for supplying a data address to the data memory, and a decoder for supplying a control signal to the data memory such that one of a read cycle, a write cycle and a read/write cycle is selected in accordance with a result of decoding an instruction. When the read/write cycle has been selected, the data memory outputs data stored at a location designated by the data address from the pointer onto one of the buses, such as the M-bus, while receiving data from another bus, such as the A-bus, and storing the data thus received at the same location as designated by the data address. In one embodiment, the data memory includes a write circuit which has a latch circuit for temporarily holding data received from the data bus in a given memory cycle preceding the read/write cycle. Data is read from a given location in the data memory and another data is subsequently written at the same location in the read/write cycle. For example, two different data buses are used for reading data and writing data, respectively. Consequently, not only the read cycle and write cycle, but also the read/write cycle are enabled, which implements a data memory higher in performance than conventional ones without using a technique of increasing the speed of circuit operation.

8 Claims, 4 Drawing Sheets

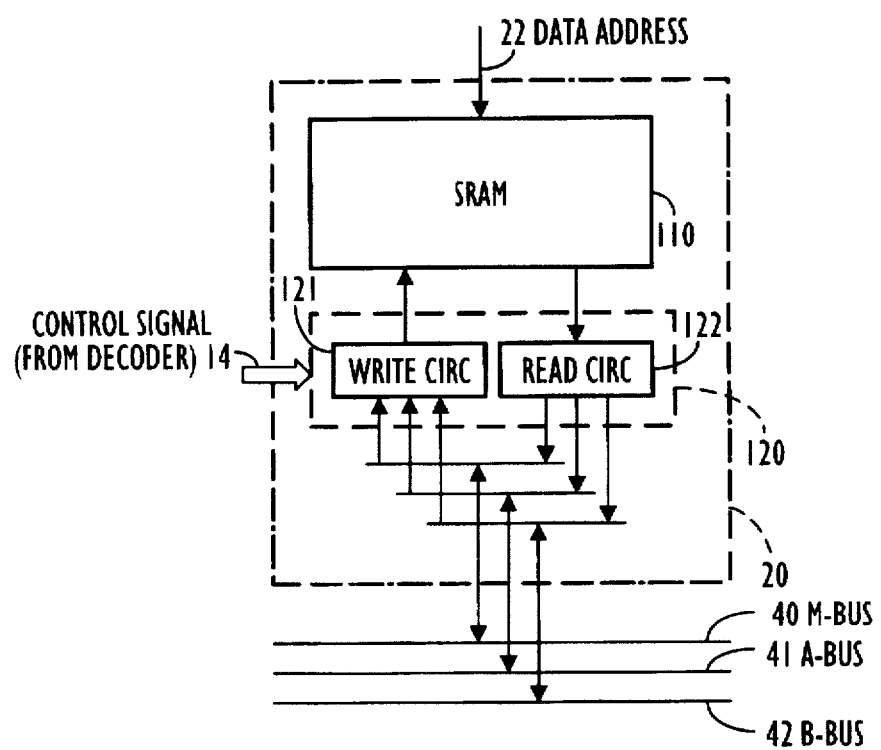

PROCESSOR AND DATA MEMORY FOR OUTPUTTING AND RECEIVING DATA ON DIFFERENT BUSES FOR STORAGE IN THE SAME LOCATION

BACKGROUND OF THE INVENTION

The present invention relates to a processor having data memories and, more particularly, to a digital signal processor (DSP).

There has been known a DSP in which an instruction memory, a plurality of data memories, an arithmetic circuit, and the like are integrated into one chip. Since the DSP is required to operate at a high speed, static random-access memories (SRAMs) which do not need refreshing are generally used in individual data memories. Each of the data memories provided in such a conventional DSP can perform either the reading of data or the writing of data in one memory cycle.

If the SRAMs in the data memories and their peripheral circuit provided in the conventional DSP are designed to operate at higher speeds, each of the data memories permits a plurality of accesses thereto in one memory cycle corresponding to one Central Processing Unit (CPU) cycle, resulting in improved performance of the data memory. If memory capacity is increased, however, it becomes difficult to implement a higher-speed SRAM. Moreover, higher-speed operation of the SRAMs and their peripheral circuit causes such problems as an increase in power consumption of the DSP.

SUMMARY OF THE INVENTION

An object of the present invention is to implement high-performance data memories without using a technique of increasing the speed of circuit operation and to provide a processor comprising the data memories.

To attain the above object, a first processor of the present invention has adopted a structure comprising: a plurality of data buses; a generator for generating a data address; a selector for selecting one of a read cycle, a write cycle, and a read/write cycle; and a data memory for outputting data stored at a location designated by the data address to any one of the plurality of data buses when the read cycle has been selected, receiving data from any one of the plurality of data buses and storing the data thus received at the location designated by the data address when the write cycle has been selected, and outputting the data stored at the location designated by the data address to any one of the plurality of data buses, while receiving data from another one of the plurality of data buses and storing the data thus received at the same location as designated by the data address, when the read/write cycle has been selected.

With the above first processor of the present invention, data is read from a given location in the data memory and another data is subsequently written at the same location in the read/write cycle. In this case, two different data buses are used for reading data and writing data, respectively. Consequently, not only the read cycle and write cycle but also the read/write cycle are enabled, which implements a data memory higher in performance than conventional ones without using a technique of increasing the speed of circuit operation.

A second processor of the present invention comprises: a data bus, a generator for generating a data address, and a data memory. Specifically, a data memory of the second processor of the present invention has a structure comprising: a storage for storing plural items of data therein; a read circuit for outputting, to the above data bus, data stored at a location designated by the data address in the storage in a read/write cycle; and a write circuit for temporarily holding data received from the data bus in a given memory cycle preceding the read/write cycle and storing the held data at the same location as designated by the data address in the storage in the read/write cycle.

With the data memory of the above second processor of the present invention, data is temporarily held by a latch circuit in the memory cycle preceding the read/write cycle. After data was read from a given location in the data memory in the read/write cycle, the data held by the latch circuit is written at the same location. Consequently, not only the normal read operation and write operation but also the read/write operation are enabled, which implements a high-performance data memory without using a technique of increasing the speed of circuit operation.

BRIEF DESCRIPTION OF THE DRAWINGS

FIG. 2 is a block diagram showing the internal structure of either one of the data memories in FIG. 1;

DETAILED DESCRIPTION OF THE INVENTION

Figure 1:
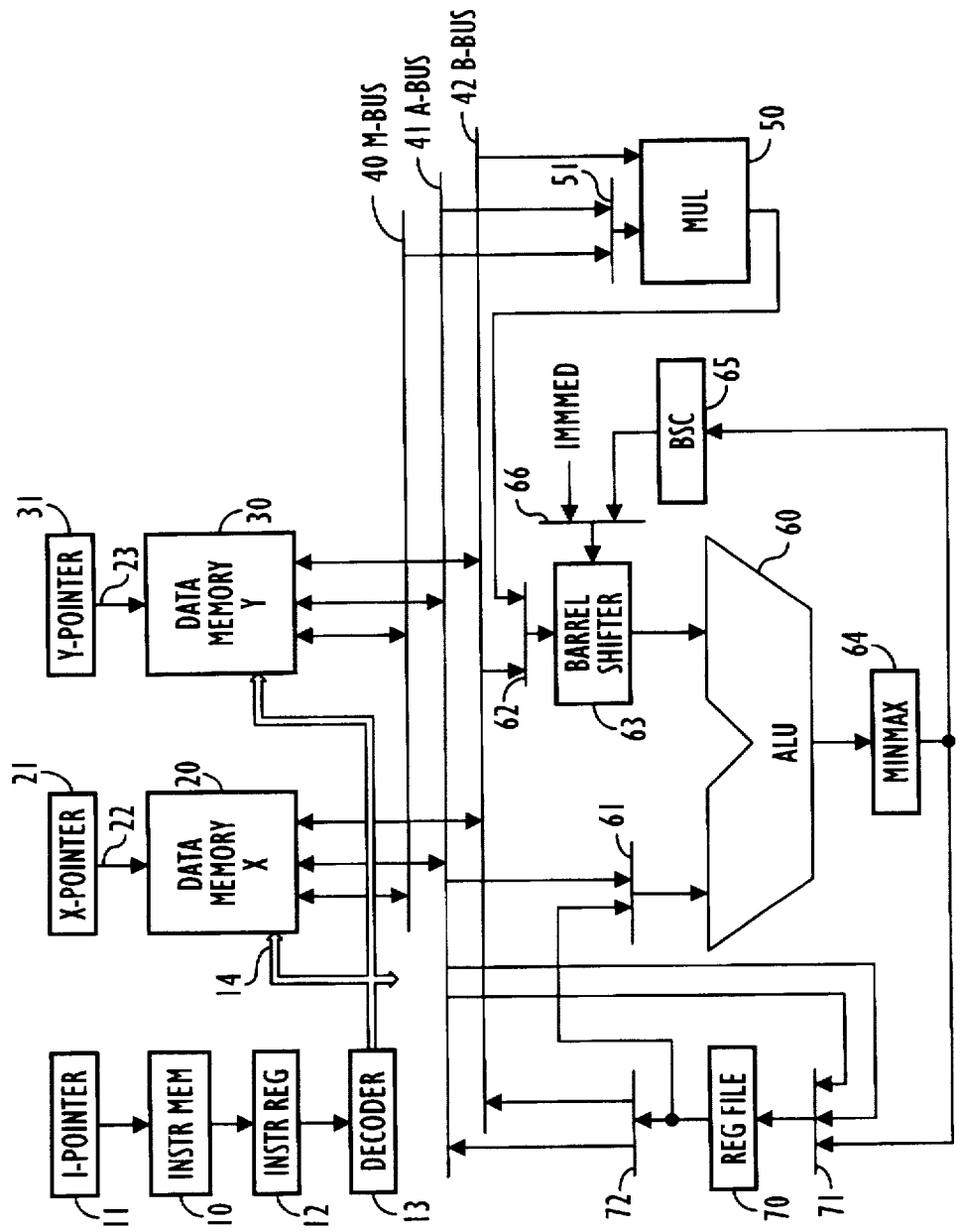
FIG. 1 is a block diagram showing the structure of a digital signal processor according to a first embodiment of the present invention.

FIG. 1 shows the structure of a digital signal processor (DSP) according to a first embodiment of the present invention. In the DSP of FIG. 1, an instruction memory 10, a pair of data memories (data memories X and Y) 20 and 30, three data buses (M-bus, A-bus, and B-bus) 40, 41, and 42, a multiplier 50, an arithmetic and logic unit (ALU) 60, and a register file 70, are integrated onto one chip. To the B-bus 42 are connected a parallel input/output (I/O) interface (not shown), a serial I/O interface (not shown), and the like.

In the instruction memory 10 are stored a plurality of instructions. An instruction pointer (I-pointer) 11 supplies an instruction address to the instruction memory 10 such that an instruction is fetched. The fetched instruction is held by an instruction register 12. A decoder 13 decodes the instruction held by the instruction register 12 and supplies, in accordance with the result of decoding, a control signal 14 to the functional blocks of the DSP.

In the data memory (data memory X) 20 are stored plural items of data. A data pointer (X-pointer) 21 is for supplying a data address 22 to the data memory 20. The data memory 20 can be connected to each of the M-bus 40, A-bus 41, and B-bus 42 and receives the control signal 14 from the decoder 13.

In the data memory (data memory Y) 30 are also stored plural items of data. A data pointer (Y-pointer) 31 is for supplying a data address 23 to be supplied to the data memory 30. The data memory 30 can be connected to each one of the M-bus 40, A-bus 41, and B-bus 42 and receives the control signal 14 from the decoder 13.

The multiplier 50 has two inputs and one output. One of the two inputs of the multiplier 50 is connected to the M-bus 40 and to the A-bus 41 via a selector 51, while the other input thereof is connected directly to the B-bus 42.

The ALU 60 has two inputs and one output. One of the two inputs of the ALU 60 is connected to the A-bus 41 and to an output of the register file 70 via a selector 61. Between the output of the multiplier 50 and the other input of the ALU 60 is interposed a barrel shifter 63. An input of the barrel shifter 63 is connected to the B-bus 42 and to the output of the multiplier 50 via a selector 62. The output of the ALU 60 is supplied, as a control input, to the barrel shifter 63 via a limiter circuit (MINMAX circuit) 64, a barrel shift controller (BSC) 65, and a selector 66. The barrel shifter 63 is also constituted such that immediate data (IMMED) as a control input can be supplied thereto via the selector 66.

The register file 70 has four general-purpose registers. An input of the register file 70 is connected to the A-bus 41, to the B-bus 42, and to an output of the limiter circuit 64 via a selector 71. As described above, the output of the register file 70 can be used as one input of the ALU 60 via the selector 61, while it is connected to the A-bus 41 and to the B-bus 42 via a selector 72.

FIG. 2 shows the internal structure of the data memory (data memory X) 20 in FIG. 1. The data memory 20 of FIG. 2 has a static random-access memory (SRAM) 110 and a peripheral circuit 120. The peripheral circuit 120 consists of a write circuit 121 and a read circuit 122. The write circuit 121 comprises a selector (not shown). The read circuit 122 comprises a plurality of three-state buffers (not shown). The data address 22 from the X-pointer 21 designates a location to be accessed in the SRAM 110. The control signal 14 from the decoder 13 designates or selects one of a read cycle, a write cycle, and a read/write cycle, while designating one of the three data buses 40, 41, and 42 to which the read circuit 122 will output data in the read cycle, designating one of the three data buses 40, 41, and 42 from which the write circuit 121 will receive data in the write cycle, and designating one of the three data buses 40, 41, and 42 to which the read circuit 122 will output data and another one of the three data buses 40, 41, and 42 from which the write circuit 121 will receive data in the read/write cycle. Namely, the instruction memory 10, the instruction pointer 11, the instruction register 12, and the decoder 13 function as cycle selecting means for selecting one of the read cycle, the write cycle, and the read/write cycle. The internal structure of the data memory (data memory Y) 30 in FIG. 1 is similar to that of the data memory (data memory X) 20.

Figure 3A:
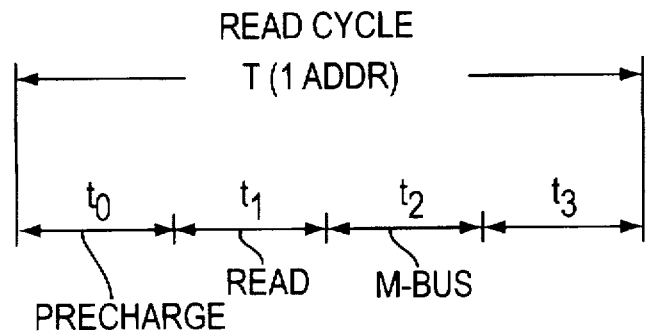
FIGS. 3A, 3B and 3C are views illustrating an example of respective operations in a read cycle, in a write cycle, and in a read/write cycle of the data memory of FIG. 2.
Figure 3B:
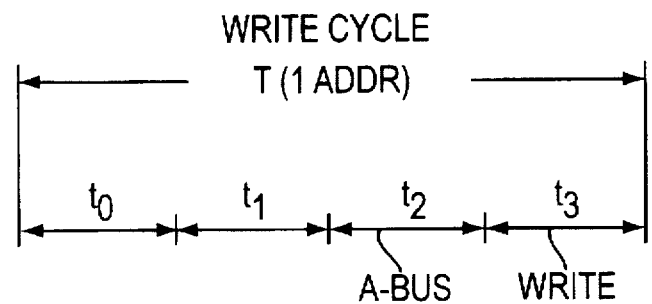
Figure 3C:
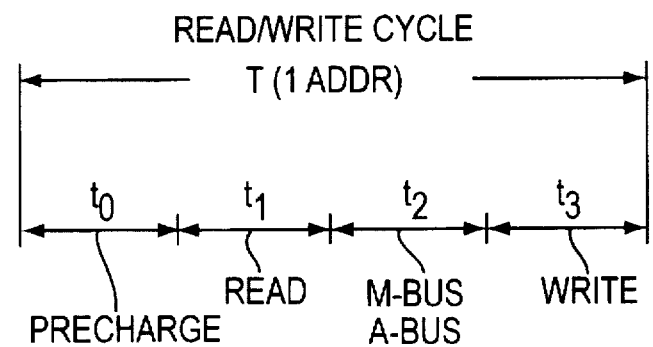

FIGS. 3A, 3B and 3C illustrate an example of respective operations in the read cycle, in the write cycle, and in the read/write cycle of the data memory 20 of FIG. 2. In the example, the read circuit 122 outputs data to the M-bus 40 in the read cycle, the write circuit 121 receives data from the A-bus 41 in the write cycle, and the read circuit 122 outputs data to the M-bus 40 while the write circuit 121 receives data from the A-bus 41 in the read/write cycle. However, the data memory 20 can also output data to the A-bus 41 or to the B-bus 42 in the read cycle. Moreover, the data memory 20 can also receive data from the M-bus 40 or from the B-bus 42 in the write cycle. Furthermore, the data memory 20 can also receive data from the A-bus 41 or from the B-bus 42 and output data to the M-bus 40 and to the B-bus 42 in the read/write cycle. In the read/write cycle, however, two different data buses are used for reading and writing, respectively. As shown in FIGS. 3A, 3B and 3C, one memory cycle T is divided into four periods $t_0$, $t_1$, $t_2$, and $t_3$. The four periods may have equal durations or different durations. During one memory cycle T, the data address 22 remains the same.

In the case of the read cycle shown in FIG. 3A, the SRAM 110 is precharged during the period $t_0$, data stored at the location designated by the data address 22 in the SRAM 110 is read during the period $t_1$, and the read data is outputted onto the M-bus 40 by the read circuit 122 during the period $t_2$. No operation is performed during the period $t_3$.

In the case of the write cycle shown in FIG. 3B, data is inputted from the A-bus 41 by the write circuit 121 during the period $t_2$ and the inputted data is stored at the location in the SRAM 110 designated by the data address 22 during the period $t_3$. No operation is performed during the period $t_0$ as well as during the period $t_1$.

In the case of the read/write cycle shown in FIG. 3C, the SRAM 110 is precharged during the period $t_0$, data stored at the location designated by the data address 22 in the SRAM 110 is read during the period $t_1$, and the read data is outputted onto the M-bus 40 by the read circuit 122 during the period $t_2$, while data is inputted from the A-bus 41 by the write circuit 121 during the same period $t_2$. The inputted data is stored at the location in the SRAM 110 designated by the data address 22 during the period $t_3$. Consequently, the data inputted from the A-bus 41 is stored at the same location at which the data outputted onto the M-bus 40 had been stored in the SRAM 110. As a result, the data outputted onto the M-bus 40 no longer exists in the SRAM 110.

In the DSP of FIG. 1, if a given load instruction is decoded by the decoder 13, data is outputted from the data memory 20 onto the A-bus 41 in the read cycle or in the read/write cycle, while the data on the A-bus 41 is stored in one of the general-purpose registers in the register file 70 via the selector 71.

If a given subtraction instruction is decoded by the decoder 13, minuend data is outputted from the data memory 20 onto the A-bus 41 in the read cycle and the minuend data on the A-bus 41 is given to the ALU 60 via the selector 61. On the other hand, subtrahend data is outputted from the data memory 30 onto the B-bus 42 in the read cycle and the subtrahend data on the B-bus 42 is given to the ALU 60 via the selector 62 and barrel shifter 63. In this case, the barrel shifter 63 does not perform a shifting operation with respect to the subtrahend data. The ALU 60 then performs subtraction, the result of which is stored in one of the general-purpose registers in the register file 70.

If a given product-sum-operation instruction is decoded by the decoder 13, the read/write cycle using the M-bus 40 and the A-bus 41 is designated for the data memory 20, while the read cycle using the B-bus 42 is designated for the data memory 30. The data outputted from the data memory 20 onto the M-bus 40 in the read/write cycle is given as multiplicand data to the multiplier 50. On the other hand, the data outputted from the data memory 30 onto the B-bus 42 in the read cycle is given as multiplier-factor data to the multiplier 50. The multiplier 50 then performs multiplication, the result of which is supplied to the barrel shifter 63. One of the general-purpose registers in the register file 70 stores an intermediate result of the product-sum operation (with the initial value of 0). The intermediate result is supplied to the ALU 60 via the selector 61 without passing through any of the three data buses (M-bus, A-bus, and B-bus) 40, 41, and 42. The barrel shifter 63 and ALU 60 then perform digit-aligning addition with respect to the intermediate result of the product-sum operations supplied from the register file 70 and to the multiplication result supplied from the multiplier 50. The result of the digit-aligning addition is stored, as an updated intermediate result of the product-sum operation, in one of the general-purpose registers in the register file 70 via the limiter circuit 64 and selector 71. By repeatedly performing the above sequence of operations, the final result of the product-sum operation is obtained in the register file 70. The final result of the product-sum operation passes through the selector 72 and A-bus 41 and is written in the data memory 20 while in the read/write cycle. In this case, the data memory 20 uses the M-bus 40 for reading and the A-bus 41 for writing, while the data memory 30 under operation in the read cycle uses the B-bus 42 for reading, so that no data collision occurs. Accordingly, the multiplier 50, the ALU 60, the barrel shifter 63, the limiter circuit 64, the barrel shift controller 65, the register file 70, and the selectors 51, 61, 62, 66, 71 and 72 function as means for performing the product-sum-operation with respect to data read onto the M-bus 40 from the data memory 20 in a given read/write cycle and supplying data via the A-bus 41 to the data memory 20 such that the data thus supplied is written in the data memory 20 in the given read/write cycle.

With the data memory 20 of FIG. 2, the period during which the data buses are used in any of the read cycle, write cycle, and read/write cycle is limited to the third period $t_2$ of one memory cycle T, as shown in FIGS. 3A, 3B and 3C. Therefore, the read circuit 122 is intended to perform the same operation in the read/write cycle as performed in the read cycle, while the write circuit 121 is intended to perform the same operation in the read/write cycle as performed in the write cycle. The SRAM 110 and peripheral circuit 120 are not particularly required to operate at high speeds in order to implement the read/write cycle.

Figure 4:
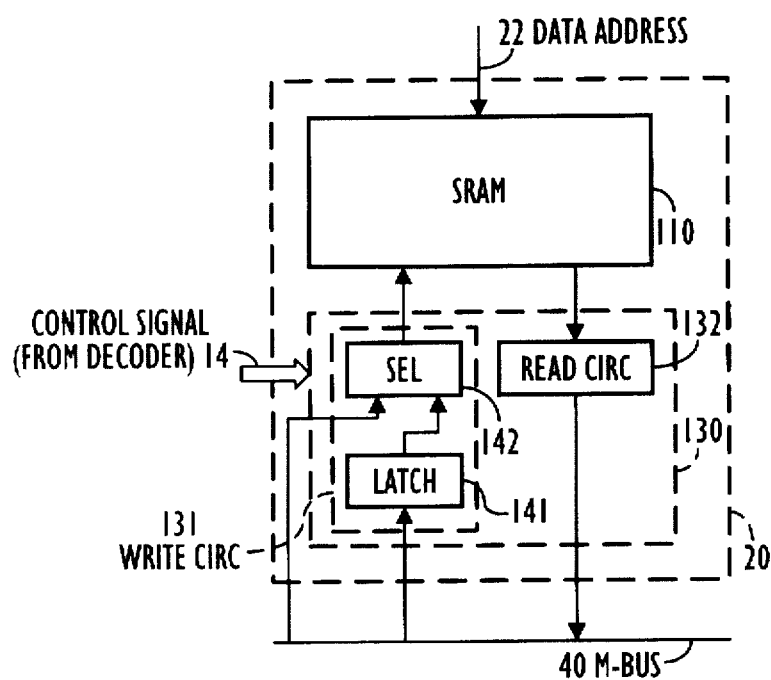
FIG. 4 is a block diagram showing a variation of the data memory of FIG. 2.

FIG. 4 shows a variation of the data memory 20 of FIG. 2. The data memory 20 of FIG. 4 has the SRAM 110 and a peripheral circuit 130 and can be connected only to the M-bus 40. The peripheral circuit 130 consists of a write circuit 131 and a read circuit 132. The write circuit 131 comprises a latch circuit 141 and a selector 142. The read circuit 132 comprises a plurality of three-state buffers (not shown). The data address 22 designates a location to be accessed in the SRAM 110. The control signal 14 designates either one of read operation, write operation, and read/write operation.

With the data memory 20 of FIG. 4, in the case of the read operation (read cycle), the SRAM 110 is precharged during the period $t_0$, data stored at the location designated by the data address 22 in the SRAM 110 is read during the period $t_1$, and the read data is outputted onto the M-bus 40 by the read circuit 132 during the period $t_2$.

In the case of the write operation (write cycle), data is inputted from the M-bus 40 by the selector 142 in the write circuit 131 during the period $t_2$ and the inputted data is stored at the location designated by the data address 22 in the SRAM 110 during the period $t_3$.

In the case of the read/write operation, data is inputted from the M-bus 40 to the latch circuit 141 during the period $t_2$ of a given memory cycle and the inputted data is temporarily held by the latch circuit 141 during the period $t_3$ of the memory cycle. In the subsequent memory cycle (read/write cycle), the SRAM 110 is precharged during the period $t_0$, data stored at the location designated by the data address 22 in the SRAM 110 is read during the period $t_1$, the read data is outputted onto the M-bus 40 by the read circuit 132 during the period $t_2$, and the data held by the latch circuit 141 is stored at the location designated by the data address 22 in the SRAM 110 via the selector 142 during the period $t_3$. Consequently, the data previously inputted from the M-bus 40 is stored at the same location at which the data outputted onto the M-bus 40 had been stored in the SRAM 110.

It is also possible to remove the selector 142 in FIG. 4 such that the output from the latch circuit 141 is supplied directly to the SRAM 110. In this case, data to be written in the SRAM 110 inevitably passes through the latch circuit 141, whether the write operation is performed or the read/write operation is performed.

Thus, according to the embodiment of the present invention, the respective access abilities of the data memories 20 and 30 are enhanced and hence the performance of the DSP using these data memories is improved.

It is also possible to use dedicated input lines and dedicated output lines for all or some of the plurality of data lines for transmitting data to and from the data memories 20 and 30. For instance, although the final result of the product-sum operation is outputted from the register file 70, passes through the A-bus 41 used in common by a plurality of circuit blocks, and is written in the data memory 20 under operation in the read/write cycle; according to the description of the example of FIG. 1, it is also possible to provide a dedicated input line extending from the register file 70 to the data memory 20 such that the final result of the product-sum operation is written in the data memory 20 via the dedicated input line.

In the case of using the dedicated input line to write data in the data memory 20, no collision occurs between read data and data to be written in the read/write cycle, so that it is not necessary to provide the selector in the write circuit 121. On the other hand, in the case of using the dedicated output line to read data from the data memory 20, it is not necessary to provide the three-state buffers in the read circuit 122.

What is claimed is:

1. A processor comprising:
   a plurality of data buses;
   means for generating a data address;
   a cycle selecting means for selecting one of a read cycle, a write cycle, and a read/write cycle; and
   a data memory for outputting data stored at a location designated by said data address to any one of said plurality of data buses when the read cycle has been selected, receiving data from any one of said plurality of data buses and storing the data thus received at the location designated by said data address when the write cycle has been selected, and outputting the data stored at the location designated by said data address to any one of said plurality of data buses, while receiving data from another one of said plurality of data buses and storing the data thus received at the same location as designated by said data address, when the read/write cycle has been selected.

2. A processor according to claim 1, further comprising means for performing an operation with respect to data read onto a data bus from said data memory in a given read/write cycle and supplying data via another data bus to said data memory such that the data thus supplied is written in said data memory in the given read/write cycle.

3. A processor according to claim 1, wherein said cycle selecting means comprises:
   an instruction memory for storing a plurality of instructions therein;
   means for supplying an instruction address to said instruction memory so that one of the plurality of instructions is fetched from said instruction memory; and
   a decoder for decoding the fetched instruction, and for selecting one of the read cycle, the write cycle, and the read/write cycle in accordance with an instruction type of the fetched instruction that has been detected through decoding.

4. A processor according to claim 3, wherein said decoder further has a function of designating, in accordance with the instruction type of the fetched instruction that has been detected through decoding, one of said plurality of data buses to which said data memory will output data when the read cycle has been selected, one of said plurality of data buses from which said data memory will receive data when the write cycle has been selected, and one of said plurality of data buses to which said data memory will output data and another one of said plurality of data buses from which said data memory will receive data when the read/write cycle has been selected.

5. A processor according to claim 4, wherein said data memory comprises:

a storing means for storing plural items of data therein;

a read circuit for outputting data stored at a location designated by said data address in said storing means to the designated one of said plurality of data buses when one of the read cycle and the read/write cycle has been selected; and a write circuit for receiving data from the designated one of said plurality of data buses and storing the data thus received at the location designated by said data address in said storing means when the write cycle has been selected, and outputting the data stored at the location designated by said data address to the designated one of said plurality of data buses, while receiving data from another designated one of said plurality of data buses and storing the data thus received at the same location as designated by said data address, when the read/write cycle has been selected.

6. A single-port data memory for use in a processor having a data bus and means for generating a data address, said data memory comprising:

a storing means for storing plural items of data therein;

a read circuit for outputting, to said data bus, data stored at a location designated by said data address in said storing means in a read/write cycle; and a write circuit for temporarily holding data received from said data bus in a given memory cycle preceding said read/write cycle and storing the held data at the same location as designated by said data address in said storing means in said read/write cycle.

7. A single-port data memory according to claim 6, wherein said write circuit comprises a latch circuit for temporarily holding the data received from said data bus.

8. A single-port data memory according to claim 7, wherein said write circuit further comprises a selector for supplying, to said storing means, one of the data temporarily held by said latch circuit and the data received directly from said data bus.

* * * * *